(12) United States Patent
Do et al.

(10) Patent No.: US 8,058,115 B2
(45) Date of Patent: Nov. 15, 2011

(54) METHOD OF FABRICATING ORGANIC THIN FILM TRANSISTOR USING SURFACE ENERGY CONTROL

(75) Inventors: Lee-Mi Do, Daejeon (KR); Kyu-Ha Baek, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/435,721

(22) Filed: May 5, 2009

(65) Prior Publication Data
US 2010/0029049 A1    Feb. 4, 2010

(30) Foreign Application Priority Data
Jul. 29, 2008   (KR) .................. 10-2008-0074124

(51) Int. Cl.
*H01L 21/00*    (2006.01)
(52) U.S. Cl. ............. 438/158; 438/99; 257/E21.411
(58) Field of Classification Search ............ 438/158, 438/99; 257/E21.411
See application file for complete search history.

(56) References Cited

U.S. PATENT DOCUMENTS

| | | | |
|---|---|---|---|
| 6,433,359 B1 | 8/2002 | Kelley et al. | |
| 6,946,676 B2* | 9/2005 | Kelley et al. | 257/40 |
| 7,132,678 B2 | 11/2006 | Kagan et al. | |
| 7,585,713 B2* | 9/2009 | Arai et al. | 438/160 |
| 2004/0212042 A1 | 10/2004 | Sagisaka et al. | |
| 2004/0238816 A1* | 12/2004 | Tano et al. | 257/40 |
| 2006/0157692 A1* | 7/2006 | Wada et al. | 257/40 |
| 2007/0087489 A1 | 4/2007 | Park et al. | |
| 2008/0042129 A1* | 2/2008 | Nakagawa et al. | 257/40 |
| 2009/0050879 A1* | 2/2009 | Yamaga et al. | 257/40 |

FOREIGN PATENT DOCUMENTS

| | | |
|---|---|---|
| EP | 1958972 A1 | 8/2008 |
| GB | 2441702 A | 3/2008 |
| KR | 10-2007-0107887 A | 11/2007 |
| KR | 2008-0025220 A | 3/2008 |
| KR | 10-2008-0066152 A | 7/2008 |
| WO | WO 2009/047981 A1 | 4/2009 |

\* cited by examiner

*Primary Examiner* — Angel Roman
*Assistant Examiner* — Stanetta Isaac
(74) *Attorney, Agent, or Firm* — Rabin & Berdo, P.C.

(57) ABSTRACT

Provided is a method of fabricating an organic thin film transistor (OTFT) using surface energy control. The method changes a polarity of a gate insulating layer to a polarity of a semiconductor channel layer to be formed on the gate insulating layer by controlling surface energy of the gate insulating layer, thereby promoting growth of the semiconductor channel layer on the gate insulating layer. According to the method, the interface characteristics between the gate insulating layer and the semiconductor channel layer are improved, and thus it is possible to implement an OTFT that can minimize leakage current and has high field effect mobility and low turn-on voltage.

14 Claims, 9 Drawing Sheets

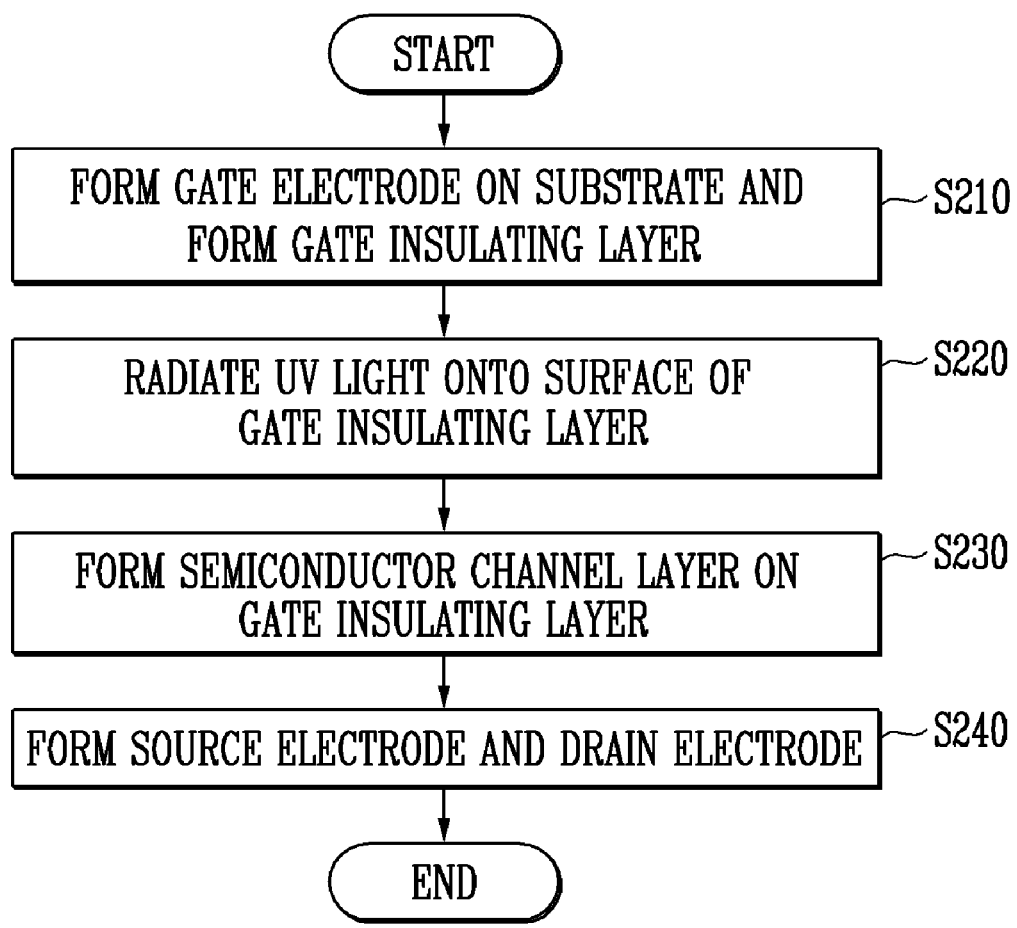

RADIATE UV LIGHT

METHOD OF FABRICATING ORGANIC THIN FILM TRANSISTOR USING SURFACE ENERGY CONTROL

CROSS-REFERENCE TO RELATED APPLICATION

This application claims priority to and the benefit of Korean Patent Application No. 10-2008-0074124, filed Jul. 29, 2008, the disclosure of which is incorporated herein by reference in its entirety.

BACKGROUND

1. Field of the Invention

The present invention relates to a method of fabricating an organic thin film transistor (OTFT) using surface energy control, and more particularly, to a method of fabricating an OTFT that can minimize leakage current and has high field effect mobility and low turn-on voltage by controlling surface energy of a gate insulating layer.

2. Discussion of Related Art

An OTFT is a device having at least one thin film layer made of an organic material. The OTFT can be processed at a low temperature, can employ a substrate made of plastic, etc., which is lightweight and flexible, and is inexpensive to produce. Thus, the OTFT has drawn attention as next-generation electronic device technology. In particular, with increasing demand for thin and lightweight displays, flexible OTFT and array technology are coming into the spotlight.

FIGS. 1A and 1B are cross-sectional views of OTFTs having a bottom-gate structure. FIG. 1A illustrates a top-contact structure, and FIG. 1B illustrates a bottom-contact structure.

Electrical characteristics of the OTFTs are greatly influenced by interface characteristics between a gate insulating layer 130 and a semiconductor channel layer 150, which play a crucial role in determining leakage current, field effect mobility, turn-on voltage, and so on.

Since the characteristics of the gate insulating layer 130 greatly effect the growth process of the semiconductor channel layer 150 deposited on the gate insulating layer 130 and thin film characteristics, the interface characteristics between the gate insulating layer 130 and the semiconductor channel layer 150 are very important.

For this reason, a method of improving characteristics of the semiconductor channel layer 150 to be deposited on a surface by performing plasma processing on the surface, or forming a self-assembled monolayer (SAM) that has a three-dimensional alignment property, has been disclosed.

However, the OTFT does not yet satisfy requirements for practical use, such as low leakage current, high field effect mobility, low turn-on voltage and high durability, and thus its use so far is limited.

SUMMARY OF THE INVENTION

The present invention is directed to fabricating an organic thin film transistor (OTFT) that can minimize leakage current and has high field effect mobility and low turn-on voltage.

One aspect of the present invention provides a method of fabricating an OTFT using surface energy control, including: forming a gate electrode on a substrate, and forming a gate insulating layer on the entire surface of the substrate; controlling surface energy of the gate insulating layer, and forming a semiconductor channel layer on the gate insulating layer using an organic semiconductor material; and forming a source electrode and a drain electrode on the semiconductor channel layer.

Here, ultraviolet (UV) light may be radiated onto the surface of the gate insulating layer for a specific time in order to control surface energy of the gate insulating layer. When UV light is radiated onto the surface of the gate insulating layer for the specific time, the polarity of the gate insulating layer is changed to that of the semiconductor channel layer to be formed on the gate insulating layer, and a difference in surface energy between the gate insulating layer and the semiconductor channel layer may become 10 dyn/cm$^2$ or less. Therefore, growth of the semiconductor channel layer on the gate insulating layer may be promoted, and the interface characteristics between the gate insulating layer and the semiconductor channel layer may be improved.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which:

FIG. 2 is a flowchart illustrating a method of fabricating an OTFT according to a first exemplary embodiment of the present invention;

DETAILED DESCRIPTION OF EXEMPLARY EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention. Throughout the embodiments, like numbers refer to like elements. The sizes and thicknesses of layers and regions may be exaggerated for clarity.

First Exemplary Embodiment

FIG. 2 is a flowchart illustrating a method of fabricating an organic thin film transistor (OTFT) according to a first exemplary embodiment of the present invention. FIGS. 3A to 3D are cross-sectional views illustrating the method of fabricating an OTFT according to the first exemplary embodiment of the present invention by stages.

The fabrication process of FIGS. 3A to 3D will be described with reference to the flowchart of FIG. 2.

Figure 1A:
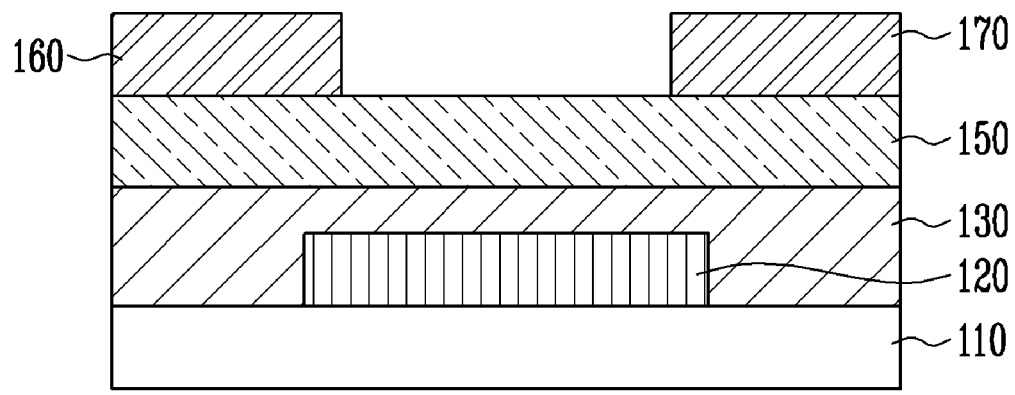
FIGS. 1A and 1B are cross-sectional views of organic thin film transistors (OTFTs) having a bottom-gate structure.
Figure 1B:
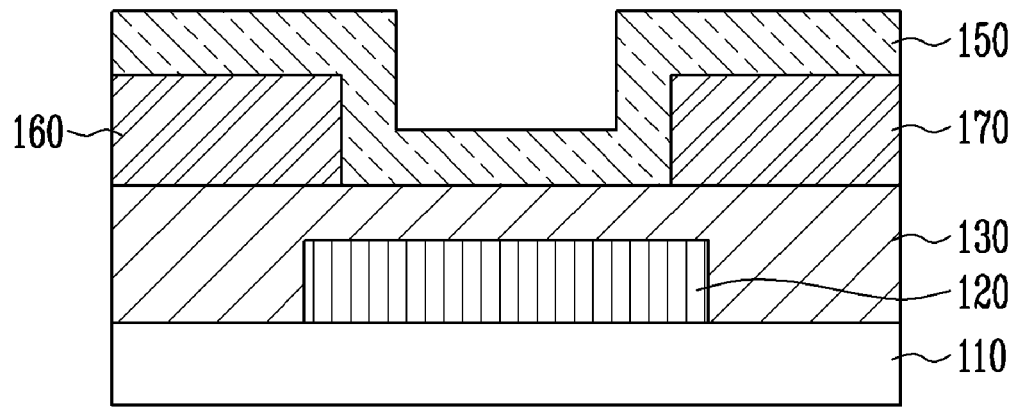
Figure 3A:
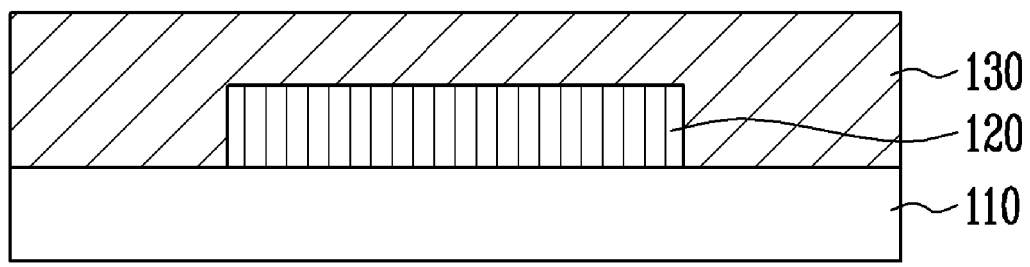
FIGS. 3A to 3D are cross-sectional views illustrating the method of fabricating an OTFT according to the first exemplary embodiment of the present invention by stages.

Referring to FIG. 3A, titanium (Ti) and gold (Au) are deposited on a substrate 110 in sequence and patterned through a lithography process to form a gate electrode 120, and then a gate insulating layer 130 is formed on the entire surface of the substrate (S210).

Here, the substrate 110 is made of monocrystalline silicon, transparent glass, transparent plastic, etc., and a p-type transistor employs a substrate doped with n-type ions. The gate insulating layer 130 is formed by depositing an inorganic material such as tetraethyl orthosilicate (TEOS), or an organic material such as polyimide and acrylate, to a thickness of 3000 Å.

Figure 3B:
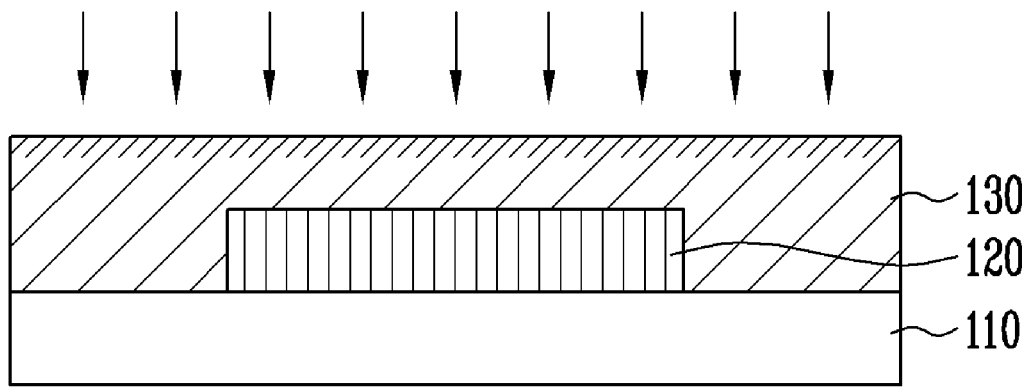

Referring to FIG. 3B, ultraviolet (UV) light is radiated onto the surface of the gate insulating layer 130 for a specific time (S220). Here, the radiation time and output power of UV light can be changed by those of ordinary skill in the art.

When UV light is radiated onto the surface of the gate insulating layer 130, generation of pinholes on the gate insulating layer 130 is prevented, and surface roughness is improved. Thus, a difference in contact angle between the gate insulating layer 130 and the semiconductor channel layer 150 to be formed on the gate insulating layer 130 decreases.

In addition, the UV light radiated onto the surface of the gate insulating layer 130 causes a chemical reaction which changes the polarity of the gate insulating layer 130 to that of the semiconductor channel layer 150 to be formed on the gate insulating layer 130. This will be described in detail below.

When the hydrophobic semiconductor channel layer 150 is formed on the hydrophilic gate insulating layer 130, adhesive strength on the interface is important.

However, when the semiconductor channel layer 150 is formed on the gate insulating layer after radiating UV light onto the surface of the gate insulating layer 130, the polarity of the gate insulating layer 130 changes from hydrophilic to hydrophobic. Thus, a difference in surface energy between the two layers is reduced to about 10 dyn/cm$^2$ or less.

In other words, an exemplary embodiment of the present invention controls surface energy of the gate insulating layer 130 by radiating UV light onto the surface of the gate insulating layer 130, thereby promoting growth of the semiconductor channel layer 150 on the gate insulating layer 130. Thus, interface characteristics between the gate insulating layer 130 and the semiconductor channel layer 150 are improved.

As a result, improvement in interface characteristics between the gate insulating layer 130 and the semiconductor channel layer 150 minimizes leakage current and greatly improves field effect mobility. This will be described in detail below.

Figure 4:
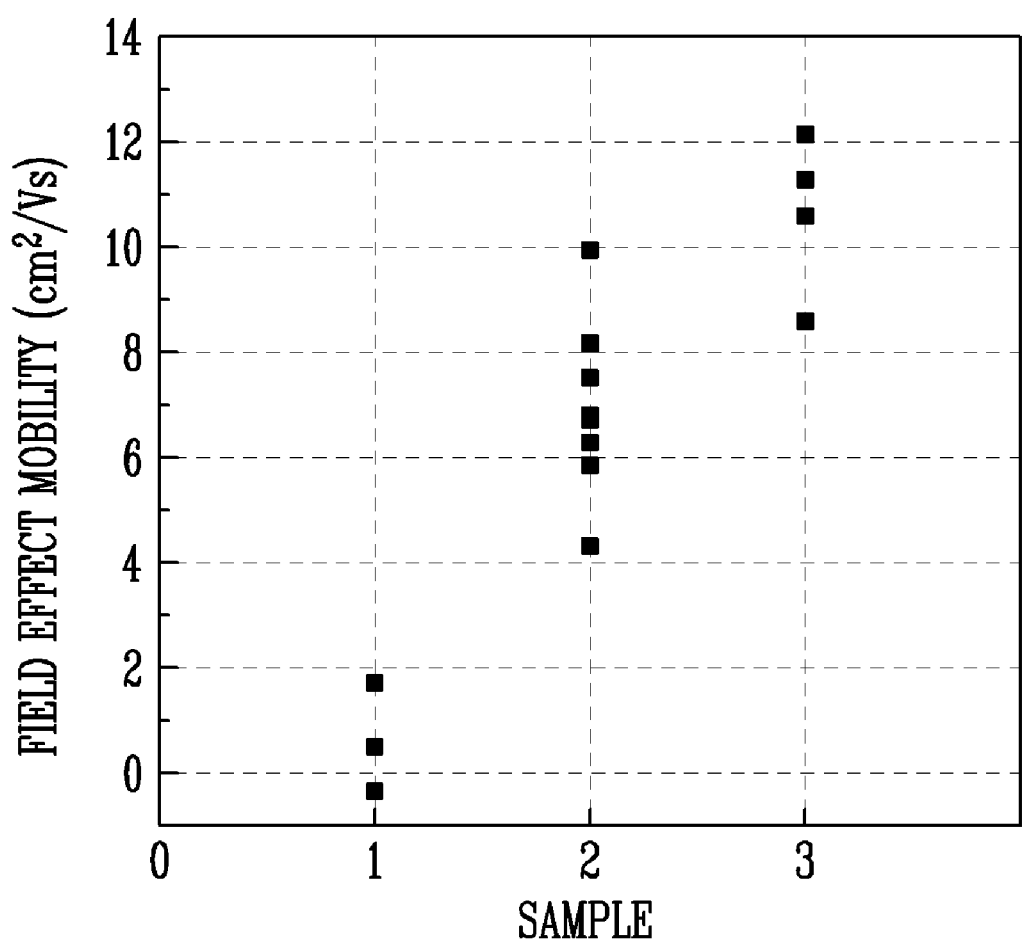
FIG. 4 shows field effect mobility of a conventional OTFT and an OTFT according to an exemplary embodiment of the present invention.

FIG. 4 shows field effect mobility of a conventional OTFT and an OTFT according to an exemplary embodiment of the present invention. Here, a gate insulating layer is made of TEOS.

In FIG. 4, sample 1 denotes a conventional OTFT, sample 2 denotes an OTFT according to an exemplary embodiment of the present invention obtained by radiating UV light onto the surface of the gate insulating layer, and sample 3 denotes an OTFT according to an exemplary embodiment of the present invention obtained by radiating UV light onto the surface of the gate insulating layer and depositing a self-assembled monolayer (SAM) on the gate insulating layer.

As can be seen in FIG. 4, the OTFT obtained by radiating UV light onto the surface of the gate insulating layer 130 has considerably improved field effect mobility in comparison with the conventional OTFT, and field effect mobility can be further improved by depositing an SAM.

Meanwhile, improvement in interface characteristics between the gate insulating layer 130 and the semiconductor channel layer 150 reduces turn-on voltage and enables low power driving. This will be described in detail below.

Figure 5:
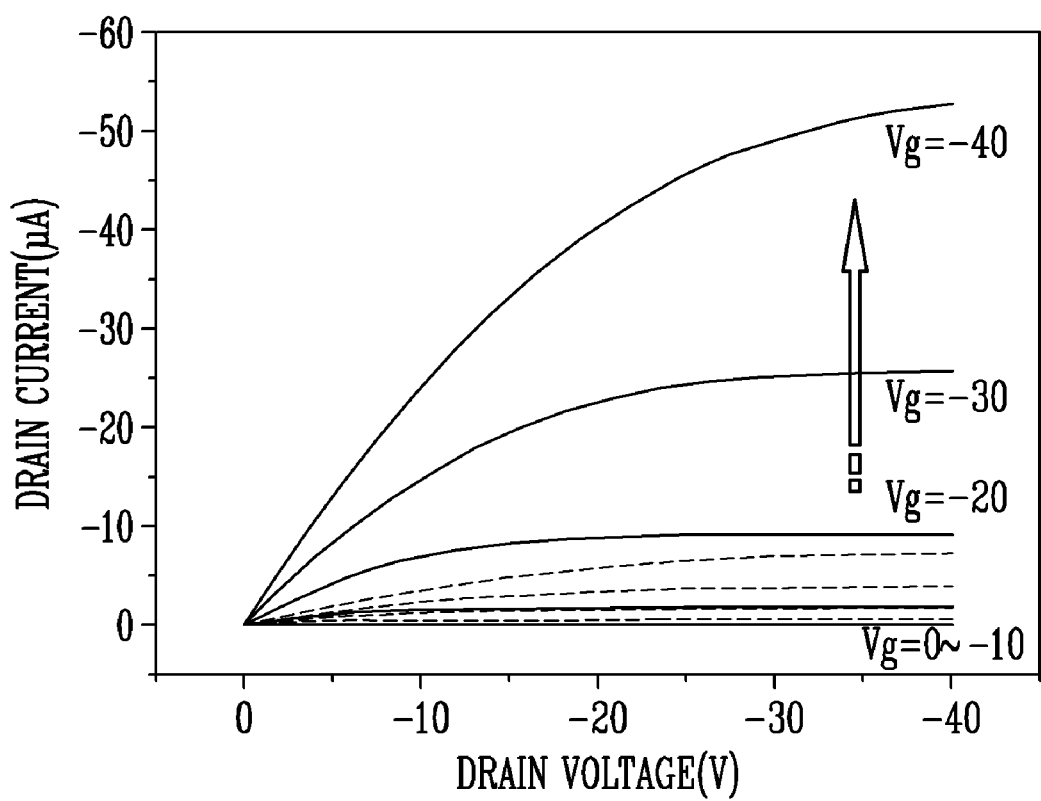
FIG. 5 is a graph showing drain current of a conventional OTFT and an OTFT according to an exemplary embodiment of the present invention.

FIG. 5 is a graph showing drain current of a conventional OTFT and an OTFT according to an exemplary embodiment of the present invention. Here, a gate insulating layer is made of polyimide.

In FIG. 5, a dotted line denotes the drain current of a conventional OTFT, and a solid line denotes the drain current of an OTFT according to an exemplary embodiment of the present invention.

As can be seen in FIG. 5, the OTFT obtained by radiating UV light onto the surface of a gate insulating layer has about six times larger drain current than the conventional OTFT. Thus, field effect mobility increases, turn-on voltage decreases, and low power driving is enabled.

Figure 3C:
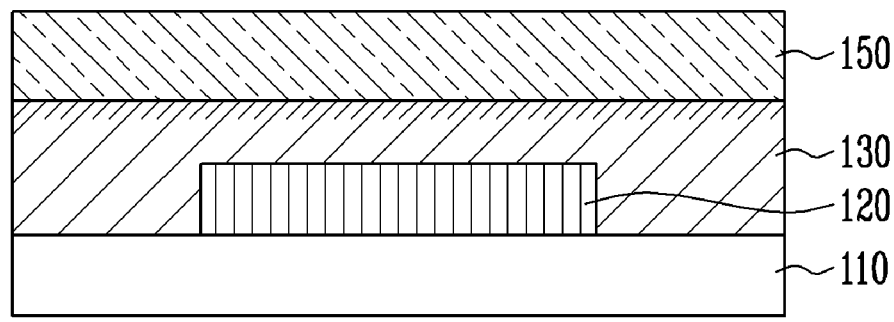

Referring to FIG. 3C, the semiconductor channel layer 150 is formed on the gate insulating layer 130 processed by UV irradiation (S230).

Here, the semiconductor channel layer 150 may be formed of an organic monomolecular semiconductor material or an organic polymer semiconductor material. More specifically, pentacene, alpha-sexithiophene (6T), etc., can be used as a p-type organic monomolecular semiconductor material, and hexadecafluorocopper phthalocyanine (F—CuPc), etc., can be used as an n-type organic monomolecular semiconductor material. In addition, poly(3-hexylthiophene) (P3HT), poly (3-octylthiophene) (P3OT), poly(3-alkylthiophene) (P3AT), etc., can be used as a p-type organic polymer semiconductor material.

Figure 3D:
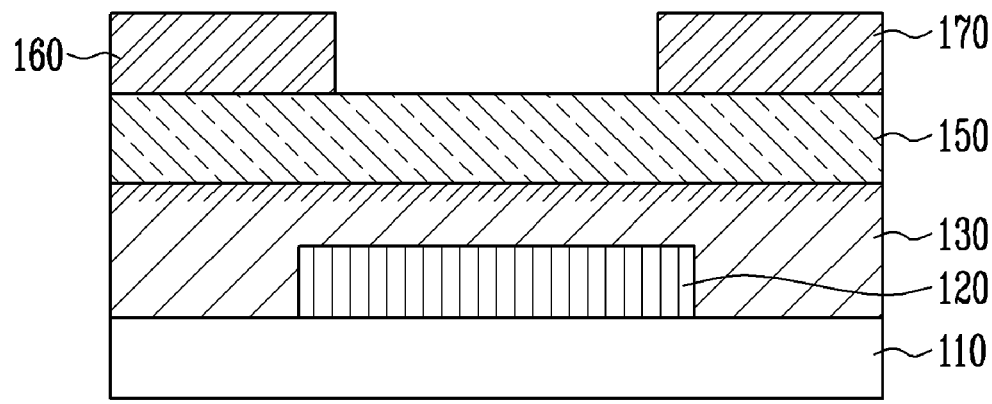

Referring to FIG. 3D, Ti is deposited on the semiconductor channel layer 150 to a thickness of 50 Å by ion beam deposition (IBD), and Au is deposited to a thickness of 1000 Å by thermal evaporation and patterned by a lithography process to form a source electrode 160 and a drain electrode 170 (S240).

According to the OTFT fabricated through the above-described process, interface characteristics between the gate insulating layer 130 and the semiconductor channel layer 150 are improved by the UV irradiation process. Consequently, it is possible to minimize leakage current, greatly improve field effect mobility, and reduce turn-on voltage.

Second Exemplary Embodiment

Figure 6:
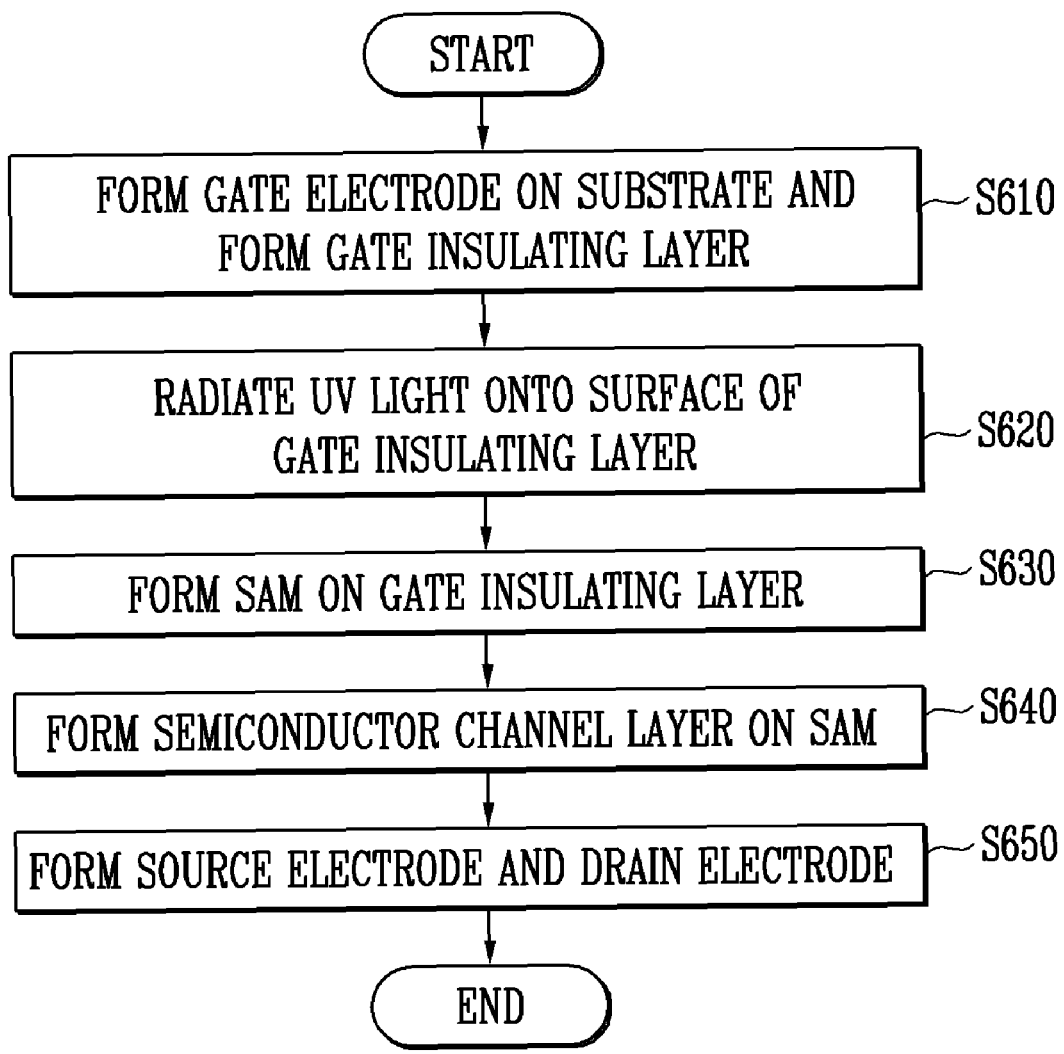
FIG. 6 is a flowchart illustrating a method of fabricating an OTFT according to a second exemplary embodiment of the present invention.

FIG. 6 is a flowchart illustrating a method of fabricating an OTFT according to a second exemplary embodiment of the present invention, and FIGS. 7A to 7D are cross-sectional views illustrating the method of fabricating an OTFT according to the second exemplary embodiment of the present invention by stages.

The fabrication process of FIGS. 7A to 7D will be described with reference to the flowchart of FIG. 6.

Figure 7A:
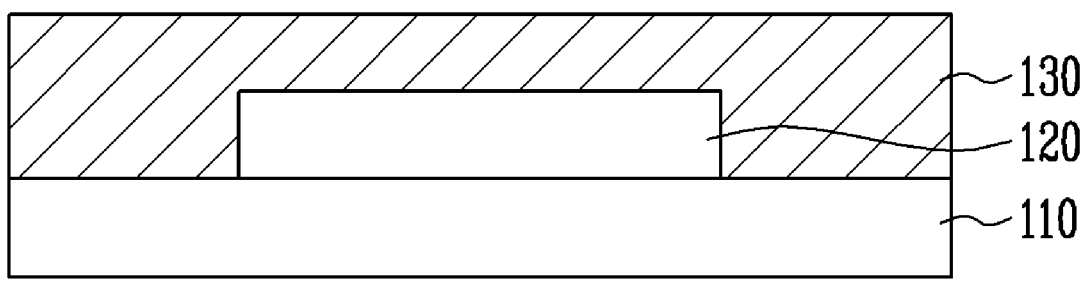
FIGS. 7A to 7D are cross-sectional views illustrating the method of fabricating an OTFT according to the second exemplary embodiment of the present invention by stages.

Referring to FIG. 7A, Ti and Au are deposited on a substrate 110 in sequence and patterned through a lithography process to form a gate electrode 120, and then a gate insulating layer 130 is formed on the entire surface of the substrate (S610).

Here, the substrate 110 is made of monocrystalline silicon, transparent glass, transparent plastic, etc., and a p-type transistor employs a substrate doped with n-type ions. The gate insulating layer 130 is formed by depositing an inorganic material, such as TEOS, or an organic material, such as polyimide and acrylate, to a thickness of 3000 Å.

Figure 7B:
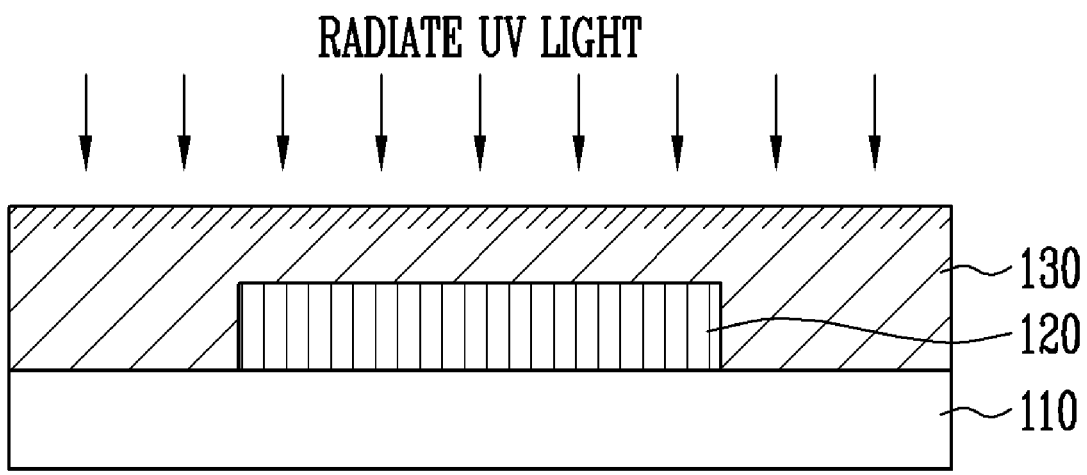

Referring to FIG. 7B, UV light is radiated onto the surface of the gate insulating layer 130 for a specific time (S620). Here, the radiation time and output power of UV light can be varied by those of ordinary skill in the art.

Figure 7C:
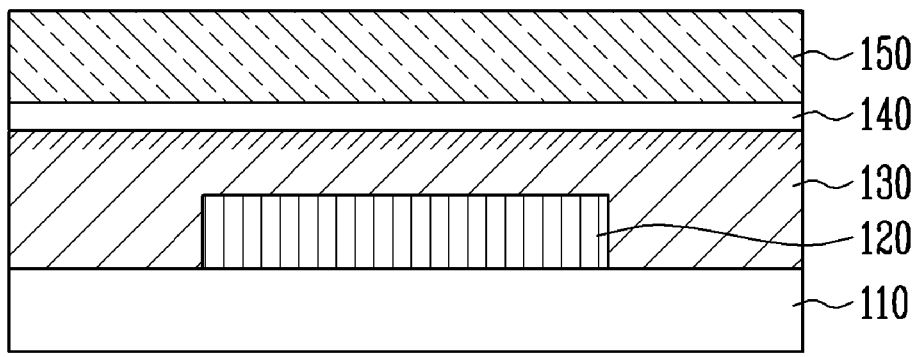

Referring to FIG. 7C, octadecyltrichlorosilane (OTS), hexamethyl-disilazane (HMDS), etc., which has the property of being three-dimensionally aligned, is spin-coated on the gate insulating layer 130 passed through the UV irradiation process, thereby forming an SAM 140 (S630).

Subsequently, a semiconductor channel layer 150 is formed on the SAM 140 (S640).

When the SAM 140 is formed, and the semiconductor channel layer 150 is formed on the SAM 140 as described above, growth of the semiconductor channel layer 150 formed on the SAM 140 is promoted by the three-dimensional alignment property of the SAM 140, and interface characteristics between the SAM 140 and the semiconductor channel layer 150 are improved.

Before the semiconductor channel layer 150 is formed, the interface characteristics between the SAM 140 and the semiconductor channel layer 150 can be improved by radiating UV light onto the surface of the SAM 140.

Figure 7D:
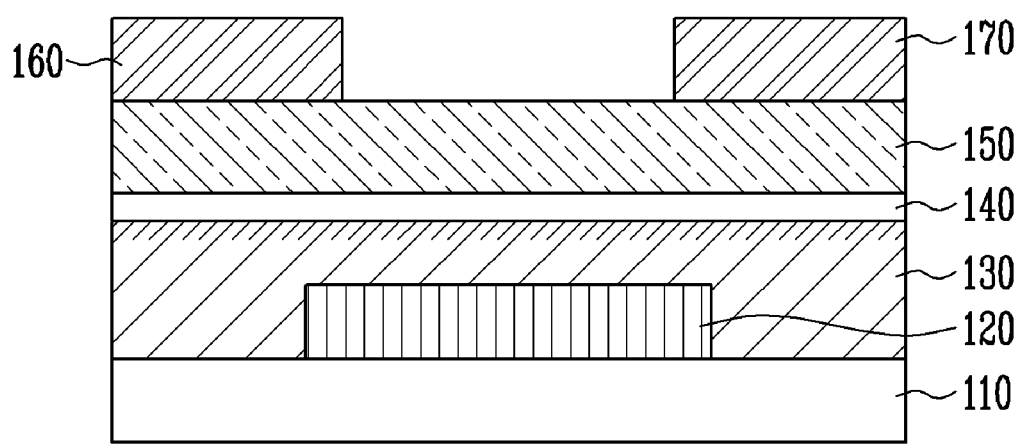

Referring to FIG. 7D, Ti is deposited on the semiconductor channel layer 150 to a thickness of 50 Å by IBD, and Au is deposited to a thickness of 1000 Å by thermal evaporation and patterned by a lithography process to form a source electrode 160 and a drain electrode 170 (S650).

According to the OTFT fabricated through the above-described process, interface characteristics between the gate insulating layer 130 and the SAM 140 are improved through a process of controlling surface energy of the gate insulating layer 130. In addition, the crystallinity of the semiconductor channel layer 150 formed on the SAM 140 is improved by the SAM 140, and thus the interface characteristics between the SAM 140 and the semiconductor channel layer 150 are also improved.

Consequently, the OTFT fabricated according to an exemplary embodiment of the present invention can minimize leakage current, greatly improve field effect mobility as shown in Table 1 below, and reduce turn-on voltage.

TABLE 1

| Whether UV light is radiated onto gate insulating layer | Charge mobility (cm²/Vs) | $I_{on}/I_{off}$ ratio | Threshold voltage (Vth) |
| --- | --- | --- | --- |
| No | 0.11 | $10^4$ | 7.5 |
| Yes | 0.75 | $10^6$ | −3.0 |

As shown in Table 1, the OTFT fabricated by radiating UV light onto the surface of the gate insulating layer 130 according to an exemplary embodiment of the present invention has field effect mobility about seven times that of a conventional OTFT. And an $I_{on}/I_{off}$ ratio which determines switching characteristics of the device is also improved by about one hundred times. In addition, a threshold voltage decreases by about 10 V such that the OTFT according to an exemplary embodiment of the present invention can be driven at lower power than a conventional OTFT.

Meanwhile, an example of an OTFT having a top-contact structure has been described, but the surface energy control technique using UV irradiation can also be applied to a bottom-contact structure in the same way. This will be described below in brief with reference to FIG. 8.

Figure 8:
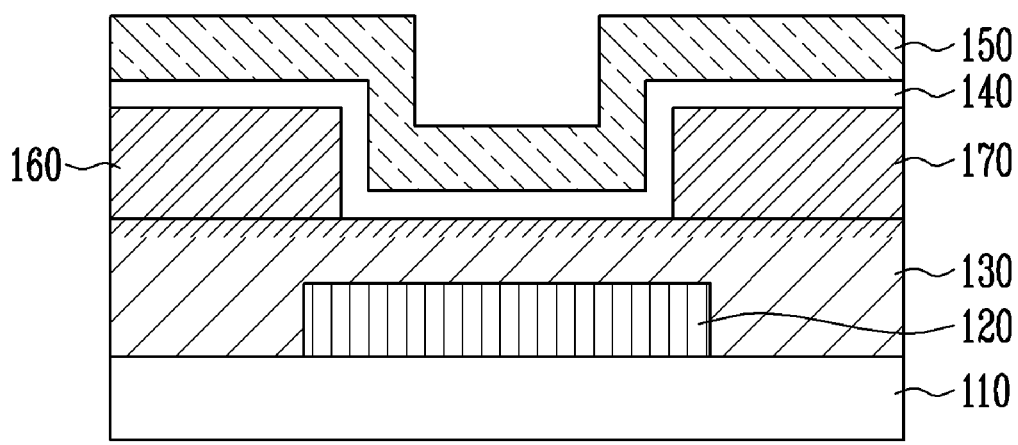
FIG. 8 is a cross-sectional view of an OTFT of a bottom-contact structure fabricated according to an exemplary embodiment of the present invention.

FIG. 8 is a cross-sectional view of an OTFT of a bottom-contact structure fabricated according to an exemplary embodiment of the present invention.

Referring to FIG. 8, when a gate electrode 120 and a gate insulating layer 130 are formed on a substrate 110, UV light is radiated onto the surface of the gate insulating layer 130, and then a source electrode 160 and a drain electrode 170 are formed on the irradiated gate insulating layer 130.

Subsequently, an SAM 140 is formed of, for example, OTS and HMDS, and then a semiconductor channel layer 150 is formed on the SAM 140.

The OTFT of a bottom-contact structure fabricated through such a process can also minimize leakage current and has improved field effect mobility and low turn-on voltage.

Although it has been described that UV light is radiated onto the surface of the gate insulating layer 130 to minimize difference in surface energy between the gate insulating layer 130 and the semiconductor channel layer 150 or the SAM 140 to be formed on the gate insulating layer 130 and to improve interface characteristics, the surface energy of the gate insulating layer 130 can be controlled using other methods.

According to an exemplary embodiment of the present invention, interface characteristics between a gate insulating layer and a semiconductor channel layer are improved by controlling surface energy of the gate insulating layer. Thus, it is possible to fabricate an OTFT that can minimize leakage current and has high field effect mobility and low turn-on voltage.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of fabricating an organic thin film transistor (OTFT) using surface energy control, comprising:
    forming a gate electrode on a substrate, and forming a gate insulating layer on the entire surface of the substrate;
    controlling surface energy of the gate insulating layer, and forming a semiconductor channel layer, a lower surface of the semiconductor channel layer being disposed on and in contact with a contact surface of the gate insulating layer using a semiconductor material, the contact surface having the controlled surface energy; and
    forming a source electrode and a drain electrode on an upper surface of the semiconductor channel layer.

2. The method of claim 1, wherein the controlling of the surface energy of the gate insulating layer comprises radiating ultraviolet (UV) light onto the contact surface of the gate insulating layer for a specific time to control the surface energy of the gate insulating layer.

3. The method of claim 2, wherein the controlling of the surface energy of the gate insulating layer comprises changing a polarity of the gate insulating layer to a polarity of the semiconductor channel layer by radiating UV light onto the surface of the gate insulating layer for the specific time.

4. The method of claim 3, wherein the controlling of the surface energy of the gate insulating layer comprises reducing a difference in surface energy between the gate insulating layer and the semiconductor channel layer to 10 dyn/cm² or less by radiating UV light onto the surface of the gate insulating layer for the specific time.

5. The method of claim 1, wherein the gate insulating layer is formed of an inorganic material or an organic material.

6. The method of claim 1, wherein the semiconductor channel layer is formed of an inorganic semiconductor material or an organic semiconductor material.

7. The method of claim 1, wherein the upper surface of the semiconductor channel layer is opposite to the lower surface of the semiconductor channel layer, and the source electrode and the drain electrode come in contact with the upper surface of the semiconductor channel layer.

8. The method of claim 1, wherein the entire lower surface of the semiconductor channel layer that faces the gate insulating layer comes in contact with the contact surface of the gate insulating layer.

9. A method of fabricating an organic thin film transistor (OTFT) using surface energy control, comprising:
    forming a gate electrode on a substrate, and forming a gate insulating layer on the entire surface of the substrate;
    controlling surface energy of the gate insulating layer, forming a self-assembled monolayer (SAM) on and in contact with a contact surface of the gate insulating layer with octadecyltrichlorosilane (OTS) or hexamethyldisilazane (HMDS) having a property of being three-dimensionally aligned, the contact surface having the controlled surface energy, and forming a semiconductor channel layer on the SAM above the contact surface of the gate insulating layer using a semiconductor material, the semiconductor channel layer having a lower surface facing the SAM and an upper surface opposite to the lower surface; and
    forming a source electrode and a drain electrode on the upper surface of the semiconductor channel layer.

10. The method of claim 9, wherein the gate insulating layer is formed of an inorganic material or an organic material.

11. The method of claim 9, wherein the semiconductor channel layer is formed of an inorganic semiconductor material or an organic semiconductor material.

12. The method of claim 9, wherein the controlling of the surface energy of the gate insulating layer comprises radiating ultraviolet (UV) light onto the contact surface of the gate insulating layer for a specific time to control the surface energy of the gate insulating layer.

13. The method of claim 12, wherein the controlling of the surface energy of the gate insulating layer comprises reducing a difference in surface energy between the gate insulating layer and the SAM by radiating UV light onto the surface of the gate insulating layer for the specific time.

14. The method of claim 9, wherein the entire lower surface of the semiconductor channel layer that faces the SAM comes in contact with an upper surface of the SAM.

* * * * *